(12) United States Patent
Lin et al.

(10) Patent No.: US 10,636,779 B2
(45) Date of Patent: Apr. 28, 2020

(54) PACKAGING DEVICE FOR INTEGRATED POWER SUPPLY SYSTEM AND PACKAGING METHOD THEREOF

(71) Applicant: SJ Semiconductor (Jiangyin) Corporation, Jiangyin (CN)

(72) Inventors: Jangshen Lin, Jiangyin (CN); Chengchung Lin, Jiangyin (CN); Chihhung Ho, Jiangyin (CN); Qifeng Cai, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 15/760,558

(22) PCT Filed: Aug. 1, 2017

(86) PCT No.: PCT/CN2017/095430
§ 371 (c)(1),
(2) Date: Mar. 15, 2018

(87) PCT Pub. No.: WO2018/129907
PCT Pub. Date: Jul. 19, 2018

(65) Prior Publication Data
US 2019/0043846 A1 Feb. 7, 2019

(30) Foreign Application Priority Data

Jan. 11, 2017 (CN) .......................... 2017 1 0018589
Jan. 11, 2017 (CN) ..................... 2017 2 0028551 U

(51) Int. Cl.
H01L 25/18 (2006.01)
H01L 23/00 (2006.01)
(Continued)

(52) U.S. Cl.
CPC .......... H01L 25/18 (2013.01); H01L 21/4853 (2013.01); H01L 21/4857 (2013.01);
(Continued)

(58) Field of Classification Search
CPC . H01L 2224/32145; H01L 2224/48145; H01L 25/0657; H01L 2224/16145
See application file for complete search history.

(56) References Cited

U.S. PATENT DOCUMENTS 8,552,563 B2  10/2013  Law et al.
9,935,076 B1 * 4/2018  Ramachandran ....... H01L 25/03
(Continued)

FOREIGN PATENT DOCUMENTS

CN   101859762 A   10/2010
CN   105428260 A   3/2016
CN   106531710 A   3/2017

OTHER PUBLICATIONS

PCT International Search Report for application PCT/CN2017/095430 dated Sep. 27, 2017.
(Continued)

Primary Examiner — Ngan V Ngo
(74) Attorney, Agent, or Firm — Alston & Bird LLP

(57) ABSTRACT

The present disclosure provides a packaging device for an integrated power supply system and a packaging method thereof. The packaging device comprises: a power consumption system die and a power supply system die below the power consumption system die; the power supply system die comprises an active module, a passive module and a rewiring layer, wherein the active module and the reactive module are molded, and the rewiring layer is located above the molded active module and passive module, to connect the active module and the passive module, and a plurality of power supply tracks are disposed in the rewiring layer to
(Continued)

abut the power consumption system die; the power consumption system die is abutted with the plurality of power supply tracks; and an external power source supplies power to the power consumption system die through the power supply system die.

18 Claims, 6 Drawing Sheets

(51) Int. Cl.
      *H01L 25/00*       (2006.01)
      *H01L 23/538*       (2006.01)
      *H01L 21/48*       (2006.01)
      *H01L 23/31*       (2006.01)
      *H01L 23/488*       (2006.01)
      *H01L 23/49*       (2006.01)
      *H01L 21/683*       (2006.01)
      *H01L 25/065*       (2006.01)
      *H01L 21/56*       (2006.01)
      *H01L 23/498*       (2006.01)

(52) U.S. Cl.
    CPC ...... *H01L 21/6835* (2013.01); *H01L 23/3128* (2013.01); *H01L 23/488* (2013.01); *H01L 23/49* (2013.01); *H01L 23/5383* (2013.01); *H01L 24/16* (2013.01); *H01L 25/00* (2013.01); *H01L 25/0657* (2013.01); *H01L 25/50* (2013.01); *H01L 21/56* (2013.01); *H01L 23/49816* (2013.01); *H01L 2221/68345* (2013.01); *H01L 2221/68359* (2013.01); *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/48145* (2013.01); *H01L 2224/73204* (2013.01); *H01L 2224/81005* (2013.01); *H01L 2924/15192* (2013.01); *H01L 2924/15311* (2013.01); *H01L 2924/18161* (2013.01); *H01L 2924/19105* (2013.01); *H01L 2924/19106* (2013.01)

(56) References Cited

U.S. PATENT DOCUMENTS

| | | | |
|---|---|---|---|
| 10,163,851 B2 * | 12/2018 | Yu | H01L 23/5227 |
| 2002/0008309 A1 * | 1/2002 | Akiyama | H01L 25/0652 |
| | | | 257/686 |
| 2016/0190113 A1 * | 6/2016 | Sharan | H01L 28/00 |
| | | | 257/531 |
| 2016/0372449 A1 * | 12/2016 | Rusu | H01L 23/5227 |
| 2018/0158800 A1 * | 6/2018 | El-Mansouri | H01L 25/0657 |
| 2018/0366429 A1 * | 12/2018 | Chiu | H01L 24/08 |

OTHER PUBLICATIONS

PCT Written Opinion of the International searching Authority for application PCT/CN2017/095430 dated Sep. 27, 2017.

* cited by examiner

PACKAGING DEVICE FOR INTEGRATED POWER SUPPLY SYSTEM AND PACKAGING METHOD THEREOF

CROSS REFERENCES TO RELATED APPLICATIONS

This application is the national stage application of the PCT Application No. PCT/CN2017/095430, entitled "Package for Integrated Power Supply System and Packaging Method Thereof", filed on Aug. 1, 2017, claiming priority to the Chinese Patent Application No. CN2017100185891, entitled "A Packaging device for Integrated Power Supply System and Packaging Method Thereof", filed with the State Intellectual Property Office on Jan. 11, 2017, Chinese Patent Application No. CN2017200285518, entitled "A Packaging device for Integrated Power Supply System and Packaging Method Thereof", filed with the State Intellectual Property Office on Jan. 11, 2017, the contents of which are incorporated herein by reference in its entirety.

TECHNICAL FIELD

The present disclosure relates to the technical field of semiconductor packaging, in particular, to a packaging device for an integrated power supply system and a packaging method thereof.

BACKGROUND

All computing and communication systems respectively need a power supply system. The power supply system transforms a high voltage of a power source into many different low voltages needed by discrete devices in the system. The efficiency of the power supply system decides the power loss of step-down transformation, while the track number of a power supply decides the number of supportable discrete voltage supplies or devices.

Current power supply technologies face the following challenges:

1. With the shrinkage of critical dimensions in a process and the decrease of device voltage, the efficiency of power transmission is reduced, such that the power consumption is higher.

2. In order to add more power supply tracks, more power supply components need to be copied, e.g., the number of elements is increased, the size of circuit boards is increased, the number of layers of the circuit boards is increased, and the system volume, cost and weight are therefore increased.

3. Due to the restriction of wire spacing and wire width of the rewiring layer, the package size needs to be increased.

Therefore, how to improve the power transmission efficiency and increase the available number of different voltage tracks has already become an important technical problem which needs to be urgently solved by one skilled in the art.

SUMMARY

In view of the above, the purpose of the present disclosure is to provide a packaging device for an integrated power supply system and a packaging method thereof, which are used for solving various existing problems.

In order to realize the above-mentioned purpose and other related purposes, the present disclosure provides packaging devices for an integrated power supply system, comprising:

a power consumption system die and a power supply system die below the power consumption system die, wherein the power supply system die comprises an active module, a passive module and a rewiring layer, wherein the active module and the reactive module are packaged and molded, and the rewiring layer is located above the packaged and molded active module and passive module, realizes electrical connection between the active module and the passive module and provides a plurality of power supply tracks abutted with the power consumption system die;

the power consumption system die is abutted with the plurality of power supply tracks and is packaged and fixed on the rewiring layer; and an external power source directly supplies power to the power consumption system die through the power supply system die.

Optionally, the power supply system die is a high-voltage power supply system die, which transforms a high voltage of the external power source into a plurality of different low voltages needed in the power consumption system die, and provides a plurality of low-voltage power supply tracks abutted with the power consumption system die.

Optionally, the active module comprises a controller and a step-down transformer, and the passive module comprises a capacitor, an inductor and a resistor.

Optionally, the active module and the passive module are transversely arranged.

Optionally, base solder bumps are provided below the power supply system die, metal leads are provided between the base solder bumps and the rewiring layer, and the power supply system die is fixed on a packaging substrate through the base solder bumps and realizes electrical connection with an external device through the metal leads and the base solder bumps.

Optionally, the active module and the passive module and the rewiring layer are connected through μ-bumps or directly soldered through metal pads.

Optionally, the power consumption system die and the rewiring layer are connected through a plurality of μ-bumps.

In order to realize the above-mentioned purpose and other related purposes, the present disclosure further provides a packaging method for the integrated power supply system, comprising the following steps:

providing a carrier;

forming a rewiring layer on the carrier;

mounting an active module and a passive module of a power supply system die on the rewiring layer and forming metal leads, wherein the rewiring layer realizes electrical connection between the active module and the passive module, and provides a plurality of power supply tracks abutted with a power consumption system die;

packaging and molding the active module, the passive module and the metal leads on the rewiring layer;

forming base solder bumps connected with the metal leads;

removing the carrier; and mounting the power consumption system die on the rewiring layer, realizing the abutment between the power consumption system die and the plurality of power supply tracks, and packaging and fixing the power consumption system die on the rewiring layer.

Optionally, the rewiring layer comprises: metal connecting wires, vias and a dielectric layer provided around the metal connecting wires and the vias, the metal connecting wires realize electrical connection between the active module, the passive module and the metal leads, and interlayer connection between a plurality of layers of metal connecting wires is realized through the vias.

Optionally, an under bump metal is provided on the rewiring layer, and the active module, the passive module, the metal leads and the power consumption system die are electrically connected with the rewiring layer through the under bump metal.

Optionally, the power supply system die is a high-voltage power supply system die, which transforms a high voltage of an external power source into a plurality of different low voltages needed in the power consumption system die, and provides a plurality of low-voltage power supply tracks abutted with the power consumption system die.

Optionally, the active module comprises a controller and a step-down transformer, and the passive module comprises a capacitor, an inductor and a resistor.

Optionally, the active module and the passive module are transversely arranged.

Optionally, the active module and the passive module and the rewiring layer are connected through μ-bumps or directly soldered through metal pads.

Optionally, each metal lead comprises a plurality of metal wires and the metal wires are formed on the rewiring layer by adopting a wire bonding method.

Optionally, a method for packaging and molding the active module, the passive module and the metal leads on the rewiring layer is compression molding, transfer molding, liquid seal molding, vacuum lamination or spin coating.

Optionally, after the active module, the passive module and the metal leads are packaged and molded on the rewiring layer, excessive packaging and molding materials covering the active module, the passive module and the metal leads are ground away.

Optionally, the power consumption system die and the rewiring layer are connected through a plurality of μ-bumps.

As described above, the packaging device for the integrated power supply system and the packaging method provided by the present disclosure have the following beneficial effects:

The present disclosure provides a new method for integrating an entire power supply system into a packaging device. By using a three-dimensional core stacking technology, the power transmission efficiency is improved and the available number of different voltage tracks is increased.

In the present disclosure, by using the existing active element and the passive element to form a 2.5D intermediate layer, then integrating the power consumption system die such as ASIC into the top of the 2.5D intermediate layer to obtain a 3D stack structure and compactly integrating the power supply system die below the power consumption system die, the problem the existing power supply system faces is solved. The power supply system die can provide thousands of low-voltage power supply tracks for direct abutment with the power consumption system through the μ-bumps; and since the passive element is integrated, the parasitic resistance of the PCB can be eliminated, the power supply efficiency and the response time of power supply control are improved, the fidelity is also improved by decreasing voltage drop and noise, and the needed design margin is decreased.

DESCRIPTION OF COMPONENT REFERENCE NUMERALS

Figure 1:
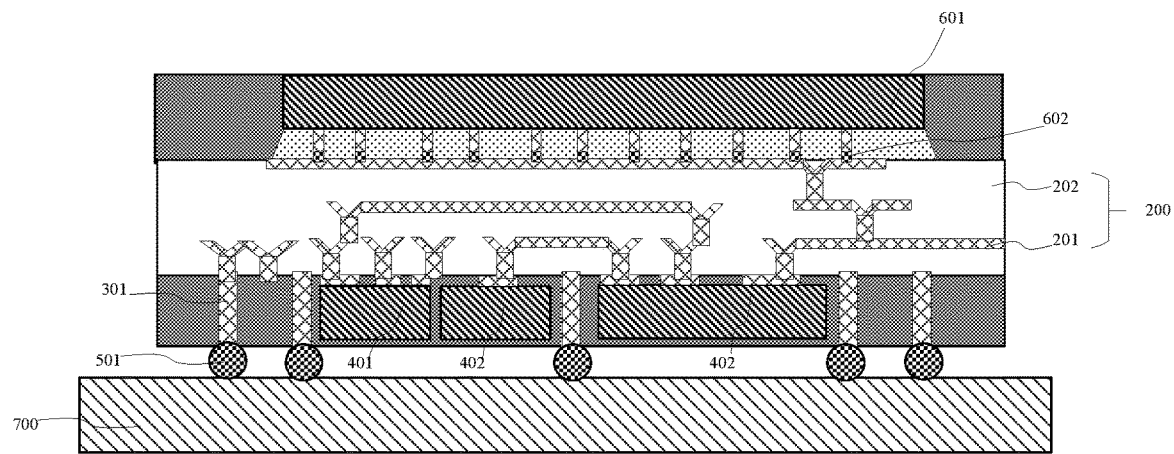
FIG. 1 illustrates a structural schematic view of a packaging device for an integrated power supply system provided by an embodiment according to the present disclosure.

101 Carrier
1011 Adhesion layer
200 Rewiring layer
201 Metal connecting wire
202 Dielectric layer
301 Metal lead
401 Active module
402 Passive module
4021 Inductance element
4022 Capacitance element
501 Base solder bump
502 Protective layer
601 Power consumption system die
602 μ-bump
S1-S7 Steps

DETAILED DESCRIPTION OF THE PREFERRED EMBODIMENTS

The implementation modes of the present disclosure will be described below through specific examples. One skilled in the art can easily understand other advantages and effects of the present disclosure according to content disclosed in the description. The present disclosure may also be implemented or applied through other different specific implementation modes. Various modifications or variations may be made to all details in the description based on different points of view and applications without departing from the spirit of the present disclosure. It needs to be stated that the following embodiments and the features in the embodiments may be mutually combined under a situation of no conflict.

It needs to be stated that the drawings provided in the following embodiments are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complex.

In order to overcome the problem the power supply system faces in current techniques, the present disclosure provides a new technology for integrating an entire power supply system into a packaging device by using a three-dimensional chip stacking technology. Please refer to FIG. 1. The present disclosure provides a packaging device for an integrated power supply system, comprising: a power consumption system die 601 and a power supply system die below the power consumption system die 601, wherein the power supply system die comprises an active module 401, a passive module 402 and a rewiring layer 200, wherein the active module 401 and the reactive module 402 are packaged and molded, and the rewiring layer 200 is located above the packaged and molded active module 401 and passive module 402 to realize electrical connection between the active module 401 and the passive module 402 and provide a plurality of power supply tracks abutted with the power consumption system die 601;

the power consumption system die 601 is abutted with the plurality of power supply tracks and is packaged and fixed on the rewiring layer 200; and an external power source directly supplies power to the power consumption system die 601 through the power supply system die.

In some embodiments of the present disclosure, the power consumption system die 601 may be an Application Specific Integrated Circuit (ASIC) die, e.g., may be a chip such as a GPU or DRAM chip, etc.

In some embodiments of the present disclosure, the power supply system die is a high-voltage power supply system die, transforms a high voltage of the external power source into a plurality of different low voltages needed in the power consumption system die 601 and provides a plurality of low-voltage power supply tracks abutted with the power consumption system die. Specifically, the active module 401 of the power supply system die may comprise a controller and a step-down transformer, and the passive module 402 may comprise a capacitor, an inductor and a resistor.

In some embodiments of the present disclosure, the active module 401 and the passive module 402 of the power supply system die are transversely arranged, such that the active module 401 and the passive module 402 are packaged in the same flat layer to facilitate electrical connection and wiring design of the rewiring layer 200 at the upper layer.

In some embodiments of the present disclosure, base solder bumps 501 are provided below the power supply system die, metal leads 301 are provided between the base solder bumps 501 and the rewiring layer 200, the entire packaging device may be fixed on a packaging substrate 700 through the base solder bumps 501, and the power supply system die may realize electrical connection with an external device through the metal leads 301 connected with the base solder bumps 501. Specifically, the base solder bumps 501 below the power supply system die may be Ball Grid Array (BGA) solder balls.

In some embodiments of the present disclosure, the active module 401 and the passive module 402 and the rewiring layer 200 may be connected through μ-bumps or directly soldered through metal pads. Specific connecting methods are varied. For example, the connection may be realized through techniques such as ultrasonic bonding, thermal compression bonding or common reflow soldering.

In some embodiments of the present disclosure, the power consumption system die 601 and the rewiring layer 200 may be connected through a plurality of μ-bumps 602. Specific connection methods may be ultrasonic bonding, thermal compression bonding or common reflow soldering.

Figure 2:
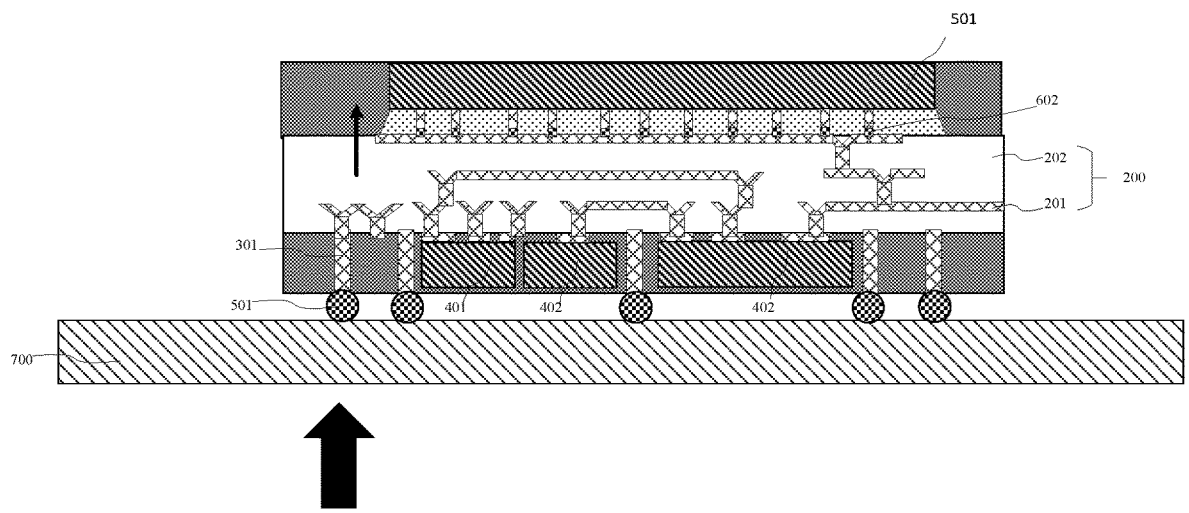
FIG. 2 illustrates a schematic diagram of a power supply principle of a packaging device for an integrated power supply system provided by an embodiment according to the present disclosure.

In the packaging device for the integrated power supply system provided by the present disclosure, the existing active element and the passive element are adopted to form a 2.5D intermediate layer, then the power consumption system die such as ASIC is integrated into the top of the 2.5D intermediate layer to obtain a 3D stack structure and the power supply system die is compactly integrated below the power consumption system die. A power supply mode is illustrated in FIG. 2. An external high-voltage power source directly supplies power to the packaging device, the power supply system of the packaging device transforms the high voltage into voltage which satisfy the needs of power consumption systems and directly supplies the voltage to the power consumption system die through the plurality of power supply tracks or μ-bumps or bumps. By adopting the technical solution provided by the present disclosure, the power supply system die can provide thousands of low-voltage power supply tracks for directly abutting with the power consumption system through the μ-bumps; and since the passive element is integrated, the parasitic resistance produced by adopting the traditional PCB can be eliminated, the power supply efficiency and the response time of power supply control are improved, the fidelity is improved by decreasing voltage drop and noise, the needed design margin is decreased and thus problems the traditional power supply system faces can be effectively solved.

Figure 3:
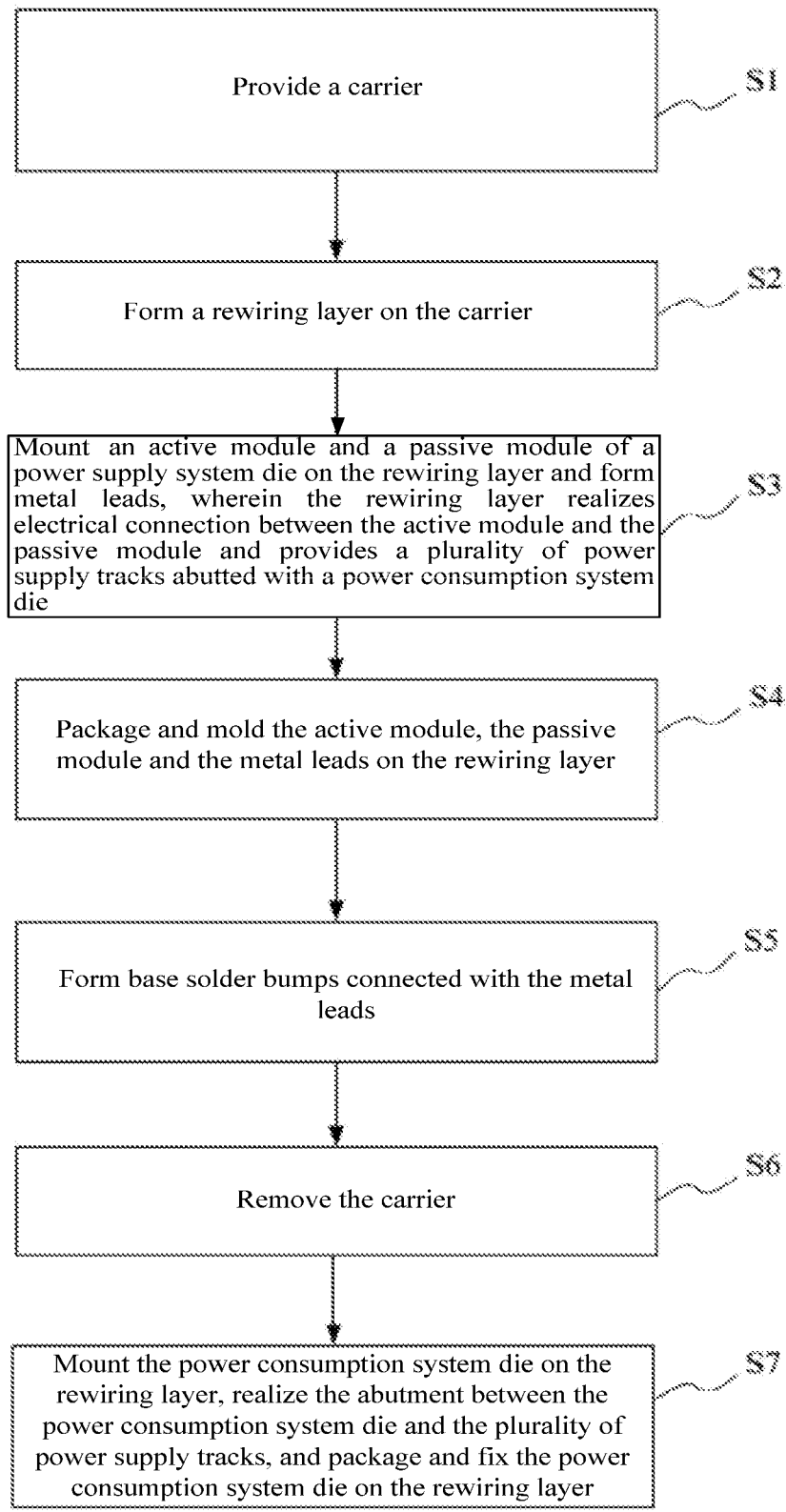
FIG. 3 illustrates a flowchart of a packaging method packaging device for an integrated power supply system provided by an embodiment according to the present disclosure.

Please refer to FIG. 3. The present disclosure further provides a packaging method of the packaging device for the integrated power supply system, comprising the following steps:

S1: providing a carrier;

S2: forming a rewiring layer on the carrier;

S3: mounting an active module and a passive module of a power supply system die on the rewiring layer and forming metal leads, wherein the rewiring layer realizes electrical connection between the active module and the passive module and provides a plurality of power supply tracks abutted with a power consumption system die;

S4: packaging and molding the active module, the passive module and the metal leads on the rewiring layer;

S5: forming base solder bumps connected with the metal leads;

S6: removing the carrier; and

S7: mounting the power consumption system die on the rewiring layer, realizing the abutment between the power consumption system die and the plurality of power supply tracks, and packaging and fixing the power consumption system die on the rewiring layer.

The packaging method will be described below in detail through specific embodiments.

Figure 4A:
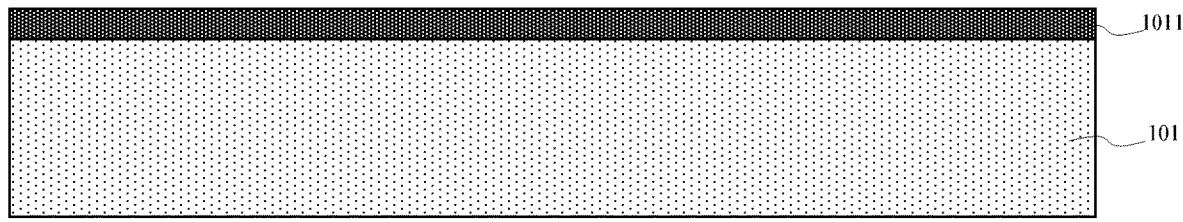
FIGS. 4a-4h illustrate process flowcharts of a packaging method for an integrated power supply system provided by an embodiment according to the present disclosure.

Firstly, as illustrated in FIG. 4a, a carrier 101 is provided. A material of the carrier 101 may be one of glass, stainless steel, silicon, silicon oxide, metal and ceramic, or other analogues. The carrier 101 may be of a flat plate type. For example, the carrier 101 may be a glass circular flat plate with certain thickness. In this embodiment, an adhesion layer 1011 is formed on a surface of the carrier 101 for adhering and fixing the rewiring layer 200. Specifically, the rewiring layer 200 may be adhered by adopting adhesive or adhesive tapes. When the carrier 101 is removed subsequently, the adhesion layer 1011 is removed concurrently. For example, the adhesion layer 1011 may be a double-sided adhesive tape which realizes adhesive removal by means of heating or UV, the adhesive's one side may be removed by means of UV and the adhesive's other side may be removed by means of heating during stripping, or the adhesive's one side is removed by means of heating and the adhesive's other side is directly torn off Methods for removing the doubled-side adhesive tape vary. Or, the adhesion layer 1011 may also be a sacrificial layer which realizes adhesive removal by means of laser heating. After the sacrificial layer is formed, the adhesive is coated onto the sacrificial layer such that the rewiring layer 200 can be adhered and fixed. During stripping, the sacrifice layer is removed by means of laser and then the adhesive is removed. The sacrificial layer may be deposited on the carrier 101 by adopting CVD and may also be obtained by coating an LTHC (light to heat) material, and the adhesive may be removed by adopting a chemical reagent.

Figure 4B:
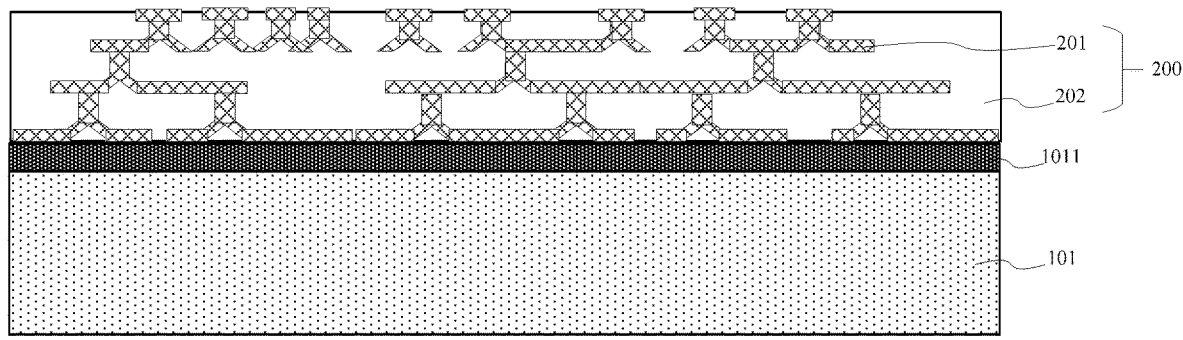

Then, as illustrated in FIG. 4b, a rewiring layer 200 is formed on the carrier 101. Specifically, the rewiring layer 200 may comprise: metal connecting wires 201, vias and a dielectric layer 202 provided around the metal connecting wires 201 and the vias, the metal connecting wires 201 realize electrical connection between the active module 401, the passive module 402 and the metal leads 301, and the interlayer connection between a plurality of layers of metal connecting wires 201 may be realized through the vias. Herein, a material of the metal connecting wires 201 may include one or more of Cu, Al, Ag, Sn, Ni, Ti and Ta, or other suitable conductive metal materials. For example, the metal connecting wires 201 may be Cu wires, and a seed layer for attaching the Cu wires may be a Ti/Cu layer. A method for forming the metal connecting wires 201 may comprise one or more of electroplating, chemical plating and silk screen printing, or other suitable metal deposition processes. A method for forming the vias may be lithography, laser drilling, mechanical drilling, reactive ion etching, nanoimprinting or other suitable via forming methods. A filling material of the vias may be solder or Cu, and a filling method may be electroplating, chemical plating, silk screen printing, wire bonding or other methods suitable for filling conductive materials into the via holes.

In this embodiment, an under bump metal (UBM) 301 may also be provided on the rewiring layer 200, and the active module 401, the passive module 402, the metal leads 301 and the power consumption system die 601 are electrically connected with the rewiring layer 200 through the under bump metal.

Figure 4C:
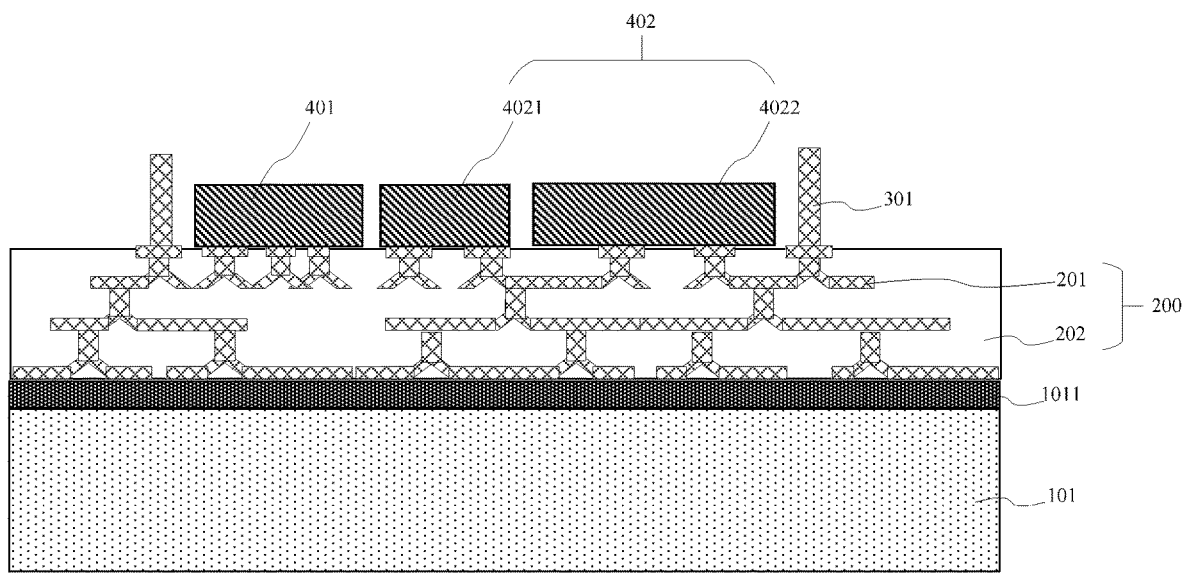

Then, as illustrated in FIG. 4c, an active module 401 and a passive module 402 of a power supply system die are mounted on the rewiring layer 200 and metal leads 301 are formed, such that the rewiring layer 200 realizes electrical connection between the active module 401 and the passive module 402 and provides a plurality of power supply tracks abutted with a power consumption system die 601.

In this embodiment, the power supply system die may be a high-voltage power supply system die, which transforms a high voltage of an external power source into a plurality of different low voltages needed in the power consumption system die and provides a plurality of low-voltage power supply tracks abutted with the power consumption system die. The active module 401 may comprise a controller and a step-down transformer, and the passive module 402 may comprise a capacitor, an inductor and a resistor. In this embodiment, the passive module 402 comprises a capacitance element 4022, an inductance element 4021, a resistor (not shown), etc. The active module 401 and the passive module 402 comprising the capacitance element 4022, the inductance element 4021, the resistor, etc., may be transversely arranged in the same flat layer to facilitate electrical connection and wiring design of the rewiring layer 200, and a specific arrangement position may be designed according to the actual needs and is not limited in the present disclosure.

In this embodiment, when the active module 401 and the passive module 402 of the power supply system die are mounted, the active module 401 and the passive module 402 and the rewiring layer 200 are connected through μ-bumps or directly soldered through metal pads. Specific connecting methods are varied. For example, the connection may be realized through a method such as ultrasonic bonding, thermal compression bonding or common reflow soldering.

The purpose of forming the metal leads 301 on the rewiring layer 200 is to realize electrical connection between the power supply system die and an external device. The rewiring layer 200 and subsequently fabricated base solder bumps 501 are spaced apart by a packaging layer containing the active module 401 and the passive module 402, and the rewiring layer 200 can realize electrical connection with the base solder bumps 501 through the metal leads 301 which penetrate through the packaging layer. In this embodiment, the metal leads 301 are vertically columnar, a number of the metal leads 301 may be multiple, and each metal lead 301 may comprise a plurality of metal wires and the metal wires may be formed on the rewiring layer 200 by adopting a wire bonding method. For example, a plurality of metal wires or copper wires may be routed at one position to form one metal lead 301. Since a routing method of wire bonding is adopted and a metal wire routed each time is thinner, a plurality of metal wires need to be routed to form one metal lead to facilitate subsequent connection with the base solder bumps 501.

Figure 4D:
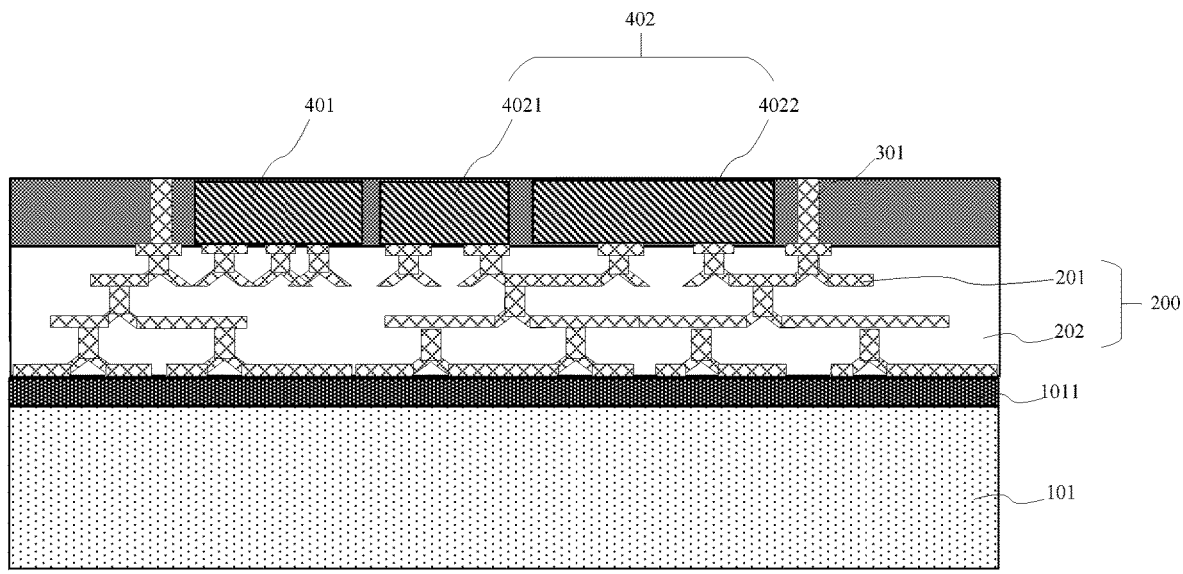

Then, as illustrated in FIG. 4d, the active module 401, the passive module 402 and the metal leads 301 are packaged and molded on the rewiring layer 200. After packaging and molding, excessive packaging and molding materials which cover the active module 401, the passive module 402 and the metal leads 301 may be ground away. Specifically, the packaging and molding method may be compression molding, transfer molding, liquid seal molding, vacuum lamination, spin coating or other suitable methods. A material for packaging and molding may be epoxy resin, liquid thermosetting epoxy resin, plastic molding compounds or analogues. A grinding method may comprise one or more of mechanical grinding, chemical polishing and etching.

Figure 4E:
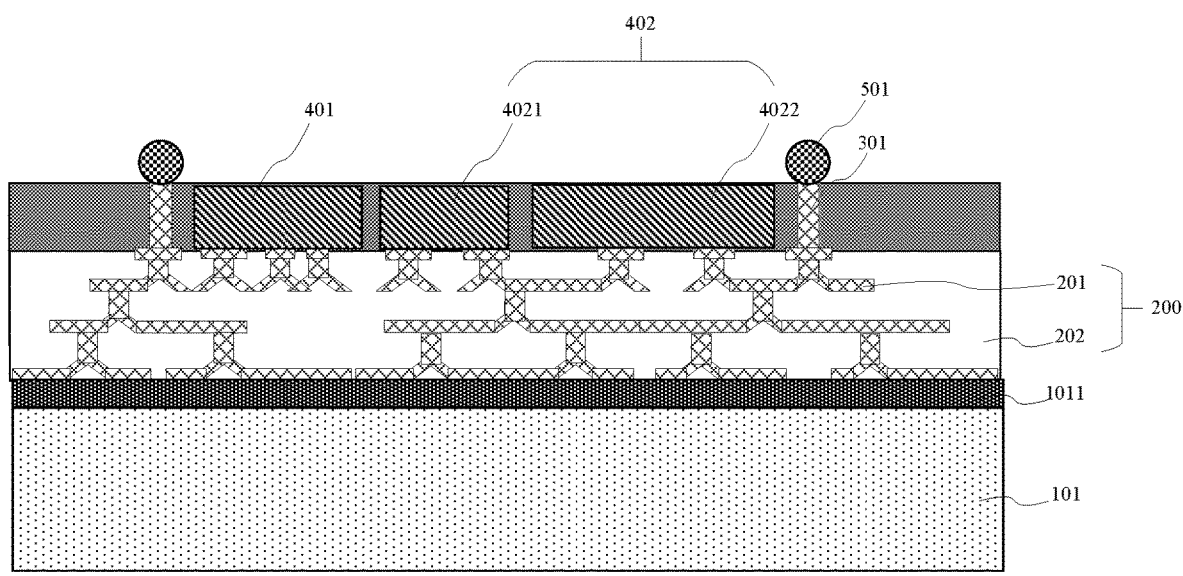

Then, as illustrated in FIG. 4e, base solder bumps 501 connected with the metal leads 301 are formed. In this embodiment, the base solder bumps 501 may be tin solder balls, etc. In this embodiment, Ball Grid Array (BGA) solder balls are adopted. The packaging device may realize fixation on a packaging substrate and electrical connection with an external device through the base solder bumps 501.

Figure 4F:
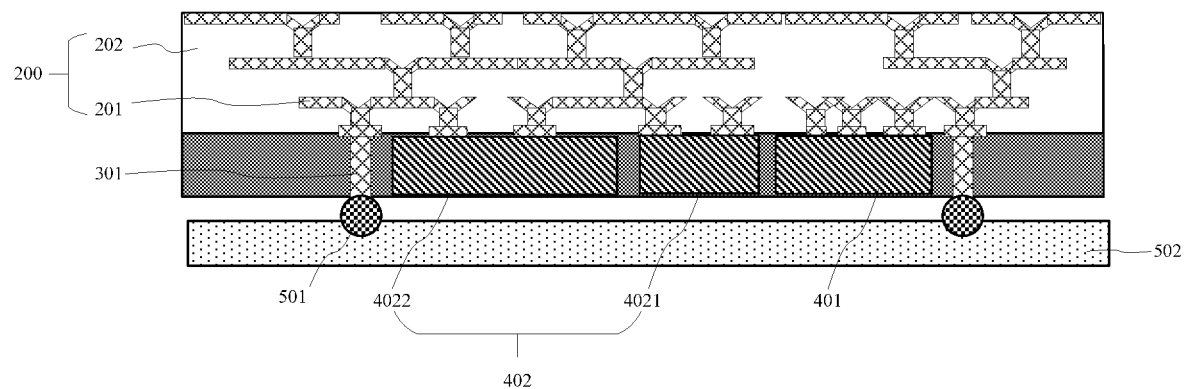

Then, as illustrated in FIG. 4f, the carrier 101 is removed and a protective layer 502 is formed on the base solder bumps 501. Specifically, a method for removing the carrier 101 may comprise one or more of mechanical grinding, chemical polishing, etching, ultraviolet stripping and mechanical stripping, or other suitable methods. In this embodiment, the adhesion layer may be removed by means of adhesive removal, to remove the carrier 101. In this embodiment, by first forming a protective layer 502 on the base solder bumps 501, the base solder bumps 501 can be prevented from being damaged in subsequent processes. The protective layer 502 may be an adhesive tape or analogues.

Figure 4G:
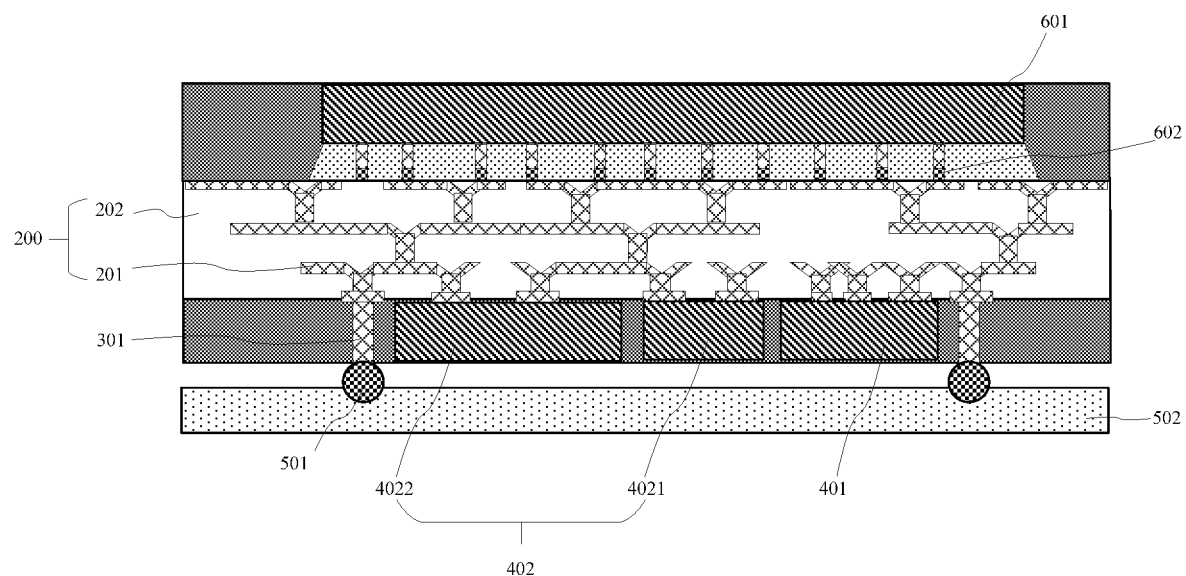
Figure 4H:
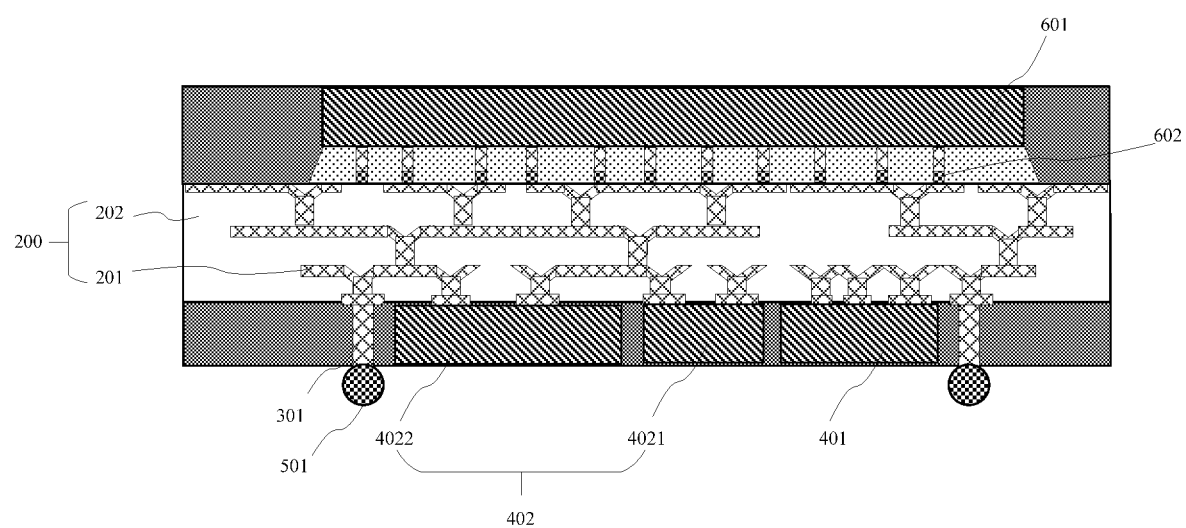

Then, as illustrated in FIG. 4g, the power consumption system die 601 is mounted on the rewiring layer 200, the abutment between the power consumption system die and the plurality of power supply tracks is realized, and then the power consumption system die 601 may be packaged and fixed on the rewiring layer 200 through underfill. In this embodiment, the power consumption system die may be an Application Specific Integrated Circuit (ASIC) die. Specifically, the power consumption system die 601 and the rewiring layer 200 may be connected through a plurality of μ-bumps 602. Specific connecting modes may be ultrasonic bonding, thermal compression bonding or common reflow soldering. The underfill may be Capillary UnderFill (CUF) or Molding UnderFill (MUF). Finally, as illustrated in FIG.

4h, after the protective layer 502 is removed, the packaging device can be mounted onto the packaging substrate for application.

To sum up, in the present disclosure, by using the three-dimensional chip stacking technology to integrate the entire power supply system into the device package, the power supply system die can provide a plurality of low-voltage power supply tracks for direct abutment with the power consumption system through the µ-bumps; and since the passive element is integrated, the parasitic resistance of the PCB can be eliminated, the power supply efficiency and the response time of power supply control are improved, the fidelity is improved by decreasing voltage drop and noise, and the design margin needed is decreased. By adopting the packaging device for the integrated power supply system and the packaging method provided by the present disclosure, the power transmission efficiency is improved, the available number of different voltage tracks is increased and various problems to which the existing power supply system faces are solved. Therefore, the present disclosure effectively overcomes various disadvantages in the current techniques and has a great industrial utilization value.

The above-mentioned embodiments are just used for exemplarily describing the principle and effect of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

What is claimed is:

1. A packaging device for an integrated power supply system, comprising:
   a power supply system die connected with an external power source; and
   a power consumption system die disposed above the power supply system die at a side away from the external power source, wherein the power consumption system die is configured to connect to a plurality of power supply tracks;
   wherein the power supply system die comprises:
      an active module and a passive module packaged and mounted side by side on a same surface of the power supply system die; and
      a rewiring layer connecting to the active and passive modules at a first surface, and connecting to the plurality of power supply tracks at a second surface;
   wherein the power consumption system die is abutted with the plurality of power supply tracks at the second surface of the rewiring layer.

2. The packaging device for the integrated power supply system according to claim 1, wherein the power supply system die transforms a voltage of the external power source into a plurality of lower voltages for the plurality of power supply tracks.

3. The package for the integrated power supply system according to claim 1, wherein the active module comprises a controller and a step-down transformer, and the passive module comprises of capacitors, inductors and resistors.

4. The packaging device for the integrated power supply system according to claim 3, wherein the controller and the step-down transformer of the active module and the capacitors, the inductors and the resistors of the passive module are arranged interchangeable in position.

5. The packaging device for the integrated power supply system according to claim 1, further comprising base solder bumps provided below the power supply system die, wherein metal leads are provided between the base solder bumps and the rewiring layer, and wherein the power supply system die is fixed on a packaging substrate through the base solder bumps and electrically connects with an external device through the metal leads and the base solder bumps.

6. The packaging device for the integrated power supply system according to claim 1, wherein the active module, the passive module, and the rewiring layer are connected through µ-bumps or metal pads.

7. The packaging device for the integrated power supply system according to claim 1, wherein the power consumption system die and the rewiring layer are connected through a plurality of µ-bumps.

8. A packaging method for the integrated power supply system comprising the following steps:
   providing a carrier;
   providing a power supply system die having an active module and a passive module mounted side by side on a same surface of the power supply system die;
   providing a power consumption system die on the carrier;
   forming a rewiring layer between the power supply system die and the power consumption system die;
   mounting the active module and the passive module of the power supply system die on and connected to a first surface of the rewiring layer;
   forming metal leads on the first surface of the rewiring layer;
   forming a plurality of power supply tracks on the second surface of the rewiring layer to abut with the power consumption system die;
   forming base solder bumps connected with the metal leads; and
   removing the carrier.

9. The packaging method for the integrated power supply system according to claim 8, wherein the rewiring layer comprises: metal connecting wires, vias and a dielectric layer surrounding the metal connecting wires and the vias, wherein the metal connecting wires connect the active module, the passive module and the metal leads, and the vias connect the metal connecting wires.

10. The packaging method for the integrated power supply system according to claim 8, wherein an under bump metal is provided on the rewiring layer, and wherein the active module, the passive module, the metal leads and the power consumption system die are electrically connected with the rewiring layer through the under bump metal.

11. The packaging method for the integrated power supply system according to claim 8, characterized in that the power supply system die is a high-voltage power supply system die, which transforms a high voltage of an external power source into a plurality of different low voltages needed in the power consumption system die, and provides a plurality of low-voltage power supply tracks abutted with the power consumption system die.

12. The packaging method for the integrated power supply system according to claim 8, wherein the active module comprises a controller and a step-down transformer, and wherein the passive module comprises a capacitor, an inductor and a resistor.

13. The packaging method for the integrated power supply system according to claim 12, wherein the controller and the step-down transformer of the active module and the capacitors, the inductors and the resistors of the passive module are arranged interchangeable in position.

14. The packaging method for the integrated power supply system according to claim 8, wherein the active module and the passive module and the rewiring layer are connected through μ-bumps or directly soldered through metal pads.

15. The packaging method for the integrated power supply system according to claim 8, wherein each metal lead comprises a plurality of metal wires formed on the rewiring layer by adopting a wire bonding method.

16. The packaging method for the integrated power supply system according to claim 8, wherein compression molding, transfer molding, liquid seal molding, vacuum lamination or spin coating is used for molding the active module, the passive module and the metal leads on the rewiring layer.

17. The packaging method for the integrated power supply system according to claim 8, wherein grounding is applied to remove the excessive molding materials covering the active module, the passive module and the metal leads.

18. The packaging method for the integrated power supply system according to claim 8, wherein the power consumption system die and the rewiring layer are connected through a plurality of μ-bumps.

\* \* \* \* \*